United States Patent
She et al.

(10) Patent No.: US 12,378,386 B2
(45) Date of Patent: *Aug. 5, 2025

(54) RESIN COMPOSITION AND APPLICATION THEREOF

(71) Applicant: SHENGYI TECHNOLOGY CO., LTD., Dongguan (CN)

(72) Inventors: Naidong She, Dongguan (CN); Qianfa Liu, Dongguan (CN); Zengbiao Huang, Dongguan (CN); Yongjing Xu, Dongguan (CN); Songgang Chai, Dongguan (CN); Yanhua Zhang, Dongguan (CN)

(73) Assignee: SHENGYI TECHNOLOGY CO., LTD., Dongguan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/575,212

(22) PCT Filed: Jul. 27, 2022

(86) PCT No.: PCT/CN2022/108291
§ 371 (c)(1),
(2) Date: Dec. 28, 2023

(87) PCT Pub. No.: WO2023/020226
PCT Pub. Date: Feb. 23, 2023

(65) Prior Publication Data
US 2024/0287282 A1    Aug. 29, 2024

(30) Foreign Application Priority Data

Aug. 16, 2021 (CN) .......................... 202110935446.3

(51) Int. Cl.
| | | |
|---|---|---|
| *C08K 3/36* | (2006.01) | |
| *C08J 5/24* | (2006.01) | |
| *C09D 7/40* | (2018.01) | |
| *C09D 7/61* | (2018.01) | |
| *C09J 7/30* | (2018.01) | |
| *C09J 11/04* | (2006.01) | |
| *H05K 1/03* | (2006.01) | |

(52) U.S. Cl.
CPC ................. *C08K 3/36* (2013.01); *C08J 5/244* (2021.05); *C08J 5/249* (2021.05); *C09D 7/61* (2018.01); *C09D 7/68* (2018.01); *C09D 7/69* (2018.01); *C09J 7/30* (2018.01); *C09J 11/04* (2013.01); *C08J 2363/00* (2013.01); *C08K 2201/005* (2013.01); *C09J 2400/166* (2013.01); *C09J 2463/00* (2013.01); *H05K 1/0366* (2013.01)

(58) Field of Classification Search
CPC combination set(s) only.
See application file for complete search history.

(56) References Cited

U.S. PATENT DOCUMENTS

| | | | | |
|---|---|---|---|---|
| 2009/0253851 | A1* | 10/2009 | Ohara | C08K 3/36 423/337 |
| 2015/0021763 | A1* | 1/2015 | Na | H01L 24/17 257/737 |
| 2016/0362546 | A1* | 12/2016 | Hasegawa | C08L 63/00 |
| 2020/0303095 | A1 | 9/2020 | Chen et al. | |

FOREIGN PATENT DOCUMENTS

| | | | |
|---|---|---|---|
| CN | 101195487 A | 6/2008 | |
| CN | 101415783 A | 4/2009 | |
| CN | 101970354 A | 2/2011 | |
| CN | 102725230 A | 10/2012 | |
| CN | 104558689 A | 4/2015 | |
| CN | 105385110 A | 3/2016 | |
| CN | 109622978 A | 4/2019 | |
| CN | 109749362 A * | 5/2019 | ............. C08K 3/013 |
| CN | 112574521 A | 3/2021 | |
| CN | 113365943 A | 9/2021 | |
| CN | 113604182 A | 11/2021 | |
| JP | 2002020113 A | 1/2002 | |
| JP | 2015026519 A | 2/2015 | |
| JP | 2019085494 A | 6/2019 | |
| JP | 2019179200 A | 10/2019 | |
| JP | 2021070726 A | 5/2021 | |
| TW | 202040902 A | 11/2020 | |
| WO | 2019189219 A1 | 10/2019 | |

OTHER PUBLICATIONS

CN109749362A Machine Translation via EPO.*
International Search Report for International Application No. PCT/CN2022/108291, mailed Oct. 10, 2022, 6 pages.
Chinese First Office Action for Chinese Application No. 202110935446.3, dated Jul. 5, 2022, 8 pages with translation.

* cited by examiner

*Primary Examiner* — Peter A Salamon
(74) *Attorney, Agent, or Firm* — Workman Nydegger

(57) ABSTRACT

The present invention provides a resin composition and an application thereof, the resin composition comprising the following components by weight percentage: 15-39% crosslinkable curable resin and 61-85% filler, the filler being silicon dioxide prepared by means of organosilicon hydrolysis, the average particle diameter D50 of the silicon dioxide being 0.1-3 μm, the ratio of D100:D10 thereof being less than or equal to 2.5, and the purity of the silicon dioxide being greater than 99.9%. The resin composition of the present invention can make prepared adhesive films and resin-coated copper foils have relatively high tensile strength and peel strength, relatively good drilling processability, controllable fluidity, good filling ability, and higher electric strength, and can achieve finer line processing ability; it is a printed circuit board material applicable to multilayer laminates, especially a printed circuit board material for multilayer laminates of thin lines.

16 Claims, No Drawings

RESIN COMPOSITION AND APPLICATION THEREOF

TECHNICAL FIELD

The present application belongs to the technical field of laminates, and relates to a resin composition and an application thereof.

BACKGROUND

As electronic information products are mass-produced and show a trend towards light, thin, short, small, and multifunctional designs, the printed circuit boards, which are the main support for electronic components, are also constantly improved at the technical level to provide high-density wiring, thin shapes, fine apertures, and high heat dissipation. However, the performance of the printed circuit board is largely determined by the substrate, such that there is an urgent need to develop a new generation of substrate.

Adhesive films or resin-coated copper foils without reinforcing materials are being developed as the next-generation substrate materials because they can achieve thinner shapes, high-density wiring, and fine apertures. Since there is no reinforcing material, inorganic fillers are generally added to improve the thermal expansion coefficient, chemical resistance, mechanical strength, and processability of the adhesive films. Silica is a good inorganic filler, but due to the wide particle size distribution and high hardness of general silica, there are problems such as inconspicuous improvement of tensile strength, poor fluidity, and processing difficulties when the silica is added in a large amount.

CN112526823A discloses a photosensitive resin composition which comprises (A) a photosensitive resin, (B) silica, (C) a photopolymerization initiator (D) a reactive diluent, and (E) an epoxy compound, wherein a cumulative volume percentage of the silica (B) is 50 volume %, a particle size D50 is more than or equal to 0.50 μm and less than or equal to 2.00 μm, D1.0 is more than or equal to 0.20 μm and less than or equal to 0.54 μm, and D99 is more than or equal to 5.00 μm and less than or equal to 8.40 μm. In this invention, D99/D50 is calculated to be greater than 2.5; meanwhile, there is no limitation on D100, and the filler particles are large.

CN103467927A discloses a thermosetting resin composition, the composition comprises 20-70 wt % of a thermosetting resin, 1-30 wt % of a curing agent, 0-10 wt % of an accelerator, and 1-50 wt % of micron-sized agglomerates of chemically synthesized silica having an average particle size of 1-10 microns, and the composition can be prepared into a prepreg by impregnation or into a coated material by coating.

As shown by the prior art above, there is no limitation on D100, the presence of large particle size silica causes defects such as unachievable high tensile strength and peel strength, and cannot satisfy the application of fine circuit lines. Therefore, the present application is expected to develop a resin composition which enables the resulting adhesive film and resin-coated copper foil to have high tensile strength, high peel strength, good drilling processability, controllable fluidity, good adhesive-filling capability, and high electric strength.

SUMMARY

In view of the deficiencies of the prior art, an object of the present application is to provide a resin composition and an application thereof. The resin composition of the present application enables the prepared adhesive film and resin-coated copper foil to have high tensile strength, high peel strength, good drilling processability, controllable fluidity, good adhesive-filling capability, high electric strength, and capability to manufacture fine circuit lines, and the resin composition is a material for printed circuit boards which can be applied to build-up multilayer boards, especially, build-up multilayer boards with fine circuit lines.

To achieve the object, the present application adopts the technical solutions below.

In an aspect, the present application provides a resin composition, and the resin composition comprises the following components by weight percentage: 15-39% of a crosslinking curable resin and 61-85% of a filler; the filler is silica prepared by organosilicon hydrolysis, wherein the silica has an average particle size D50 of 0.1-3 μm, a ratio of D100 to D10 is less than or equal to 2.5, and the silica has a purity of greater than 99.9%.

In the present application, by using silica obtained by organosilicon hydrolysis as a filler in the resin composition, which has an average particle size D50 of 0.1-3 μm, a ratio of D100 to D10 of less than or equal to 2.5, and a purity of greater than 99.9%, the resulting resin composition is able to have higher tensile strength, higher peel strength, better drilling processability, and higher electric strength.

In the resin composition of the present application, 15-39% of the crosslinking curable resin in content means that the crosslinking curable resin accounts for 15-39% of the entire resin composition, which may be, for example, 15%, 18%, 20%, 22%, 25%, 28%, 30%, 32%, 34%, 36%, 38%, or 39%, and specific point values between any two of the above point values, and for the space limitation and conciseness reason, the specific point values included in the range will not be listed exhaustively in the present application.

In the resin composition of the present application, 61-85% of the filler in content means that the filler accounts for 61-85% of the entire resin composition, which may be, for example, 61%, 63%, 65%, 68%, 70%, 72%, 74%, 76%, 78%, 80%, 82%, or 85%, and specific point values between any two of the above point values, and for the space limitation and conciseness reason, the specific point values included in the range will not be listed exhaustively in the present application.

In the present application, if the content of the filler is less than 61%, the tensile strength cannot be significantly improved, and if the content of the filler is greater than 85%, the material will have large brittleness, and at the same time the peel strength will be reduced.

In the present application, the silica has an average particle size D50 of 0.1-3 μm (for example, 0.3 μm, 0.5 μm, 0.8 μm, 1 μm, 1.3 μm, 1.5 μm, 1.8 μm, 2 μm, 2.3 μm, 2.5 μm, 2.8 μm, or 3 μm), and a ratio of D100 to D10 of less than 2.5 (for example, 2.4, 2.3, 2.2, 2.0, 1.8, 1.7, 1.5, 1.3, 1.0, etc.), and the purity of the silica is greater than 99.9% (for example, 99.91%, 99.93%, 99.95%, 99.97%, 99.99%, etc.). The silica of the present application has a narrower distribution of particle size and a higher purity. It enables the prepared adhesive film and resin-coated copper foil to have high tensile strength, high peel strength, good drilling processability, controllable fluidity, good adhesive-filling capability, high electric strength, and capability to manufacture fine circuit lines.

The particle sizes involved in the present application (for example, D50, D10, D100, etc.) are all tested by laser diffraction method with a testing instrument of Laser Particle Size Analyzer Malvern, MS3000; and the purity of the silica involved in the present application is determined by inductively coupled plasma atomic emission spectrometer ICP-AES.

Preferably, the crosslinking curable resin is a thermosetting-curable resin or a photo-curable resin.

Preferably, the crosslinking curable resin is selected from any one or a combination of at least two of an epoxy resin, a phenolic resin, cyanate ester, active ester, a polyphenylene ether resin, a maleimide resin, an organosilicon resin, a polybenzoxazole resin, a polyimide resin, a hydrocarbon resin or an acrylic resin, and preferably a combination of an epoxy resin and a phenolic resin. Preferably the combination of an epoxy resin and a phenolic resin results in superior tensile strength and peel strength.

Preferably, the epoxy resin comprises one or a combination of at least two of a bisphenol A epoxy resin, a bisphenol F epoxy resin, a phosphorus-containing epoxy resin, an MDI-modified epoxy resin, a phenolic epoxy resin, a biphenyl epoxy resin, a dicyclopentadiene epoxy resin, a naphthalene-containing epoxy resin, or an alicyclic epoxy resin.

Preferably, the phenolic resin comprises one or a combination of at least two of a bisphenol A phenolic resin, a phenol phenolic resin, a biphenyl phenolic resin, a dicyclopentadiene phenolic resin, or a naphthalene-containing phenolic resin.

Preferably, the silica is obtained by subjecting an organosilicon to a hydrolysis reaction to obtain a preliminary product and then burning the preliminary product. Preferably, the burning is performed at 800-1300° C., such as 850° C., 900° C., 905° C., 910° C., 920° C., 930° C., 950° C., 980° C., 990° C., 1000° C., 1050° C., 1100° C., 1200° C., or 1250° C.

Preferably, the organosilicon is alkoxysilane.

Preferably, the alkoxysilane comprises tetraethoxysilane, tetramethoxysilane, tetraphenoxysilane, tetra-n-butoxysilane, tetraisobutoxysilane, methyltriethoxysilane, or dimethyldiethoxysilane, and further preferably tetraethoxysilane.

Preferably, the silica has an average particle size D50 of 0.3-1 μm.

In another aspect, the present application provides a resin varnish which is obtained by dissolving or dispersing the resin composition as described above in a solvent.

The solvent in the present application is not particularly limited, and as specific examples, the solvent may be alcohols such as methanol, ethanol or butanol, ethers such as ethyl cellosolve, butyl cellosolve, ethylene glycol monomethyl ether, carbitol or butyl carbitol, ketones such as acetone, butanone, methyl ethyl ketone, methyl isobutyl ketone or cyclohexanone, aromatic hydrocarbons such as toluene, xylene or 1,3,5-trimethylbenzene, esters such as ethoxyethyl acetate or ethyl acetate, or nitrogen-containing solvents such as N,N-dimethylformamide, N,N-dimethylacetamide or N-methyl-2-pyrrolidone. The above solvents can be used alone or in a mixture of two or more, and preferably in a mixture of aromatic hydrocarbons such as toluene, xylene, or 1,3,5-trimethylbenzene and ketones such as acetone, butanone, methyl ethyl ketone, methyl isobutyl ketone or cyclohexanone. The amount of the solvent may be selected by those skilled in the art according to their experience, as long as the resulting resin varnish can achieve a suitable viscosity for use.

In another aspect, the present application provides an adhesive film, wherein the adhesive film is prepared by coating any one of the resin composition as described above on a release material and then drying and/or baking.

Preferably, the adhesive film may further comprise a protective film covering the other side of the resin composition.

Preferably, the adhesive film has a thickness of 5-300 μm, such as 8 μm, 10 μm, 15 μm, 20 μm, 30 μm, 50 μm, 80 μm, 100 μm, 120 μm, 150 μm, 180 μm, 200 μm, 250 μm, 280 μm, or 300 μm, preferably 10-200 μm, and further preferably 10-100 μm.

In another aspect, the present application provides a resin-coated copper foil, and the resin-coated copper foil comprises a copper foil and the resin composition as described above attached to the copper foil by coating and drying.

Preferably, the resin-coated copper foil further comprises a protective film covering the resin composition.

Preferably, a resin layer (the resin layer formed by the resin composition on the copper foil) of the resin-coated copper foil has a thickness of 5-300 μm, such as 8 μm, 10 μm, 15 μm, 20 μm, 30 μm, 50 μm, 80 μm, 100 μm, 120 μm, 150 μm, 180 μm, 200 μm, 250 μm, 280 μm, or 300 μm, preferably 10-200 μm, and further preferably 10-100 μm.

Preferably, the copper foil of the resin-coated copper foil has a thickness of 1-105 μm, such as 3 μm, 5 μm, 8 μm, 10 μm, 20 μm, 30 μm, 50 μm, 80 μm, 100 μm, or 104 μm, preferably 3-35 μm, and further preferably 3-12 μm.

In another aspect, the present application provides a semi-cured prepreg, wherein the semi-cured prepreg is prepared by impregnating glass fabric with the resin composition as described above and then drying.

In the present application, the glass fabric may be selected from 7628, 2116, 1131, 1080, 106, 1027, 1037, or 1078 glass fabric.

In another aspect, the present application provides a copper-clad laminate, wherein the copper-clad laminate is prepared by using one or at least two of the adhesive film as described above, the resin-coated copper foil as described above, or the semi-cured prepreg as described above.

In another aspect, the present application provides a multilayer board, and the multilayer board is prepared by using one or at least two of the adhesive film as described above, the resin-coated copper foil as described above, the semi-cured prepreg as described above, or the copper-clad laminate as described above.

Compared with the prior art, the present application has the beneficial effects below.

The silica of the present application has a good particle size uniformity and a narrower particle size distribution, and the addition of 61-85% of silica enables the resulting adhesive film to obtain better tensile modulus and peel strength than the adhesive film prepared with ordinary silica. The silica has a small average particle size and good uniformity, which can avoid the impact of large particles on the voltage resistance of the thin insulating layer and the reliability of fine circuit lines, and the silica is more suitable for laminated board with fine circuit lines. The silica has high purity which leads to better electrical performance (Df).

The adhesive film obtained from the resin composition of the present application has a tensile strength of 50-100 Mpa, a peel strength of 7.0-9.0 N/cm, an electric strength of up to 83-90 kV/mm, DK as low as 2.95-3.32, and DF as low as 0.004-0.014, and has a good drilling processability and good adhesive-filling capability, and the overall performance is good.

DETAILED DESCRIPTION

The technical solutions of the present application are further described below in terms of specific embodiments. It should be clear to those skilled in the art that the embodiments are merely used for a better understanding of the present application and should not be construed as a specific limitation to the present application.

Raw materials used in the examples and comparative examples below are as follows:
- epoxy resin: NC-3000H (Nippon Kayaku);
- phenolic resin: SN-485 (Nippon Steel);
- active ester: HP-8000-65T (DIC, Japan);
- cyanate ester: XU-371 (HUNTSMAN);
- hydrocarbon resin: B3000 (Nippon Soda);
- polyphenylene ether: MX9000 (SABIC, Saudi Arabia);
- silica 1 obtained by organosilicon hydrolysis: D50 is 3.0 μm, D100:D10 is 2.5, and the purity is 99.98%, from Jiangsu Finetal;
- silica 2 obtained by organosilicon hydrolysis: D50 is 0.1 μm, D100:D10 is 2.5, and the purity is 99.90%, from Jiangsu Finetal;
- silica 3 obtained by organosilicon hydrolysis: D50 is 0.5 μm, D100:D10 is 2.0, and the purity is 99.90%, from Jiangsu Finetal;
- silica 4 obtained by organosilicon hydrolysis: D50 is 3.5 μm, D100:D10 is 5.0, and the purity is 99.90%, from Jiangsu Finetal; and
- silica 5 obtained by organosilicon hydrolysis: D50 is 2.0 μm, D100:D10 is 5.0, and the purity is 99.00%, from Jiangsu Finetal.

Example 1

Firstly, 28 parts of an epoxy resin (NC-3000H) and 21 parts of a phenolic resin (SN-485) were dissolved into an appropriate amount of a solvent and stirred for 2 hours or more.

Then 61% of silica 3 (D50 is 0.5 μm, D100:D10 is 2.0, and the purity is 99.90%) obtained by organosilicon hydrolysis was added, and continued to be stirred for 4 hours or more to be mixed fully, so as to form a varnish with a solid content of 70%.

The above varnish was coated on a release film, dried in air, and baked in an oven at 100° C. for 5 minutes to obtain an adhesive film with a semi-cured resin layer. The semi-cured adhesive film (with a thickness of 40 μm) and a PCB board after brown oxidation were laminated and cured, removed from the release film, and then subjected to surface treatment, chemical copper plating and electroplating, so as to form a build-up printed circuit board with circuits.

Example 2

An adhesive film was prepared by the same method as in Example 1 except that the proportion of silica prepared by the chemical method used in Example 1 was changed.

Firstly, 28 parts of an epoxy resin (NC-3000H) and 21 parts of a phenolic resin (SN-485) were dissolved into an appropriate amount of a solvent and stirred for 2 hours or more.

Then 73% of silica 3 (D50 is 0.5 μm, D100:D10 is 2.0, and the purity is 99.90%) obtained by organosilicon hydrolysis was added, and continued to be stirred for 4 hours or more to be mixed fully, so as to form a varnish with a solid content of 70%.

The above varnish was coated on a release film, dried in air, and baked in an oven at 100° C. for 3 minutes to obtain an adhesive film with a semi-cured resin layer. The semi-cured adhesive film (with a thickness of 40 μm) and a PCB board after brown oxidation were laminated and cured, removed from the release film, and then subjected to surface treatment, chemical copper plating and electroplating, so as to form a build-up printed circuit board with circuits.

Example 3

An adhesive film was prepared by the same method as in Example 1 except that the proportion of silica prepared by the chemical method used in Example 1 was changed.

Firstly, 28 parts of an epoxy resin (NC-3000H) and 21 parts of a phenolic resin (SN-485) were dissolved into an appropriate amount of a solvent and stirred for 2 hours or more.

Then 85% of silica 3 (D50 is 0.5 μm, D100:D10 is 2.0, and the purity is 99.90%) obtained by organosilicon hydrolysis was added, and continued to be stirred for 4 hours or more to be mixed fully, so as to form a varnish with a solid content of 70%.

The above varnish was coated on a release film, dried in air, and baked in an oven at 100° C. for 3 minutes to obtain an adhesive film with a semi-cured resin layer. The semi-cured adhesive film (with a thickness of 40 μm) and a PCB board after brown oxidation were laminated and cured, removed from the release film, and then subjected to surface treatment, chemical copper plating and electroplating, so as to form a build-up printed circuit board with circuits.

Example 4

A resin-coated copper foil was prepared with the resin composition in Example 1.

Firstly, 28 parts of an epoxy resin (NC-3000H) and 21 parts of a phenolic resin (SN-485) were dissolved with an appropriate amount of a solvent and stirred for 2 hours or more.

Then 61% of silica 3 (D50 is 0.5 μm, D100:D10 is 2.0, and the purity is 99.90%) obtained by organosilicon hydrolysis was added, and continued to be stirred for 4 hours or more to be mixed fully, so as to form a varnish with a solid content of 70%.

The above varnish was coated on a copper foil, dried in air, and baked in an oven at 100° C. for 5 minutes to obtain a copper foil with a semi-cured resin layer. The resin-coated copper foil (with a thickness of 40 μm) and a PCB board after brown oxidation were laminated and cured, then etched and electroplated to obtain a build-up printed circuit board with circuits.

Example 5

An adhesive film was prepared by the same method as in Example 1 except that the silica prepared by the chemical method used in Example 1 was changed.

Firstly, 28 parts of an epoxy resin (NC-3000H) and 21 parts of a phenolic resin (SN-485) were dissolved with an appropriate amount of a solvent and stirred for 2 hours or more.

Then 61% of silica 1 (D50 is 3.0 μm, D100:D10 is 2.5, and the purity is 99.98%) obtained by organosilicon hydrolysis was added, and continued to be stirred for 4 hours or more to be mixed fully, so as to form a varnish with a solid content of 70%.

The above varnish was coated on a release film, dried in air, and baked in an oven at 100° C. for 3 minutes to obtain an adhesive film with a semi-cured resin layer. The semi-cured adhesive film (with a thickness of 40 μm) and a PCB board after brown oxidation were laminated and cured, removed from the release film, and then subjected to surface treatment, chemical copper plating and electroplating, so as to form a build-up printed circuit board with circuits.

Example 6

An adhesive film was prepared by the same method as in Example 1 except that the silica prepared by the chemical method used in Example 1 was changed.

Firstly, 28 parts of an epoxy resin (NC-3000H) and 21 parts of a phenolic resin (SN-485) were dissolved with an appropriate amount of a solvent and stirred for 2 hours or more.

Then 61% of silica 2 (D50 is 0.1 μm, D100:D10 is 2.5, and the purity is 99.90%) obtained by organosilicon hydrolysis was added, and continued to be stirred for 4 hours or more to be mixed fully, so as to form a varnish with a solid content of 70%.

The above varnish was coated on a release film, dried in air, and baked in an oven at 100° C. for 3 minutes to obtain an adhesive film with a semi-cured resin layer. The semi-cured adhesive film (with a thickness of 40 μm) and a PCB board after brown oxidation were laminated and cured, removed from the release film, and then subjected to surface treatment, chemical copper plating and electroplating, so as to form a build-up printed circuit board with circuits.

Example 7

An adhesive film was prepared by the same method as in Example 1 except that the resins used in Example 1 were changed.

Firstly, 20 parts of an epoxy resin (NC-3000H), 10 parts of a cyanate ester (XU-371) and 10 parts of an active ester (HP-8000-65T) were dissolved with an appropriate amount of a solvent and stirred for 2 hours or more.

Then 61% of silica 3 (D50 is 0.5 μm, D100:D10 is 2.0, and the purity is 99.90%) obtained by organosilicon hydrolysis was added, and continued to be stirred for 4 hours or more to be mixed fully, so as to form a varnish with a solid content of 70%.

The above varnish was coated on a release film, dried in air, and baked in an oven at 100° C. for 3 minutes to obtain an adhesive film with a semi-cured resin layer. The semi-cured adhesive film (with a thickness of 40 μm) and a PCB board after brown oxidation were laminated and cured, removed from the release film, and then subjected to surface treatment, chemical copper plating and electroplating, so as to form a build-up printed circuit board with circuits.

Example 8

An adhesive film was prepared by the same method as in Example 1 except that the resins used in Example 1 were changed.

Firstly, 20 parts of a hydrocarbon resin (XU-371), 20 parts of a polyphenylene ether resin (MX9000) and 5 parts of a co-crosslinking agent (DVB) were dissolved with an appropriate amount of a solvent and stirred for 2 hours or more.

Then 61% of silica 3 (D50 is 0.5 μm, D100:D10 is 2.0, and the purity is 99.90%) obtained by organosilicon hydrolysis was added, and continued to be stirred for 4 hours or more to be mixed fully, so as to form a varnish with a solid content of 70%.

The above varnish was coated on a release film, dried in air, and baked in an oven at 100° C. for 3 minutes to obtain an adhesive film with a semi-cured resin layer. The semi-cured adhesive film (with a thickness of 40 μm) and a PCB board after brown oxidation were laminated and cured, removed from the release film, and then subjected to surface treatment, chemical copper plating and electroplating, so as to form a build-up printed circuit board with circuits.

Example 9

A boding sheet was prepared with the resin composition in Example 7.

Firstly, 20 parts of an epoxy resin (NC-3000H), 10 parts of a cyanate ester (XU-371) and 10 parts of an active ester (HP-8000-65T) were dissolved with an appropriate amount of a solvent and stirred for 2 hours or more.

Then 61% of silica 3 (D50 is 0.5 μm, D100:D10 is 2.0, and the purity is 99.90%) obtained by organosilicon hydrolysis was added, and continued to be stirred for 4 hours or more to be mixed fully, so as to form a varnish with a solid content of 70%.

The above varnish was glued on glass fabric, dried in air, and baked in an oven at 100° C. for 5 minutes to obtain a semi-cured prepreg. A plurality of prepregs were stacked together, combined with copper foils on the top and bottom surfaces, laminated and cured, so as to obtain a copper-clad laminate.

Comparative Example 1

An adhesive film was prepared by the same method as in Example 1 except that the silica prepared by the chemical method used in Example 1 was changed.

Firstly, an epoxy resin (NC-3000H) and 21 parts of a phenolic resin (SN-485) were dissolved with an appropriate amount of a solvent and stirred for 2 hours or more.

Then 61% of silica 4 (D50 is 3.5 μm, D100:D10 is 5.0, and the purity is 99.90%) obtained by organosilicon hydrolysis was added, and continued to be stirred for 4 hours or more to be mixed fully, so as to form a varnish with a solid content of 70%.

The above varnish was coated on a release film, dried in air, and baked in an oven at 100° C. for 3-5 minutes to obtain an adhesive film with a semi-cured resin layer. The semi-cured adhesive film (with a thickness of 40 μm) and a PCB board after brown oxidation were laminated and cured, removed from the release film, and then subjected to surface treatment, chemical copper plating and electroplating, so as to form a build-up printed circuit board with circuits.

Comparative Example 2

An adhesive film was prepared by the same method as in Example 1 except that the silica prepared by the chemical method used in Example 1 was changed.

Firstly, an epoxy resin (NC-3000H) and 21 parts of a phenolic resin (SN-485) were dissolved with an appropriate amount of a solvent and stirred for 2 hours or more.

Then 61% of silica 5 (D50 is 2.0 μm, D100:D10 is 5.0, and the purity is 99.00%) obtained by organosilicon hydrolysis was added, and continued to be stirred for 4 hours or more to be mixed fully, so as to form a varnish with a solid content of 70%.

The above varnish was coated on a release film, dried in air, and baked in an oven at 100° C. for 3-5 minutes to obtain an adhesive film with a semi-cured resin layer. The semi-cured adhesive film (with a thickness of 40 μm) and a PCB board after brown oxidation were laminated and cured, removed from the release film, and then subjected to surface treatment, chemical copper plating and electroplating, so as to form a build-up printed circuit board with circuits.

Comparative Example 3

An adhesive film was prepared by the same method as in Example 1 except that the silica prepared by the chemical method used in Example 1 was changed to silicon micropowder.

Firstly, an epoxy resin (NC-3000H) and 21 parts of a phenolic resin (SN-485) were dissolved with an appropriate amount of a solvent and stirred for 2 hours or more.

Then 61% of silicon micropowder (SC2500-SQ) was added, and continued to be stirred for 4 hours or more to be mixed fully, so as to form a varnish with a solid content of 70%.

The above varnish was coated on a release film, dried in air, and baked in an oven at 100° C. for 3-5 minutes to obtain an adhesive film with a semi-cured resin layer. The semi-cured adhesive film (with a thickness of 40 μm) and a PCB board after brown oxidation were laminated and cured, removed from the release film, and then subjected to surface treatment, chemical copper plating and electroplating, so as to form a build-up printed circuit board with circuits.

Comparative Example 4

An adhesive film was prepared by the same method as in Example 1 except that the proportion of silica prepared by the chemical method used in Example 1 was changed.

Firstly, 28 parts of an epoxy resin (NC-3000H) and 21 parts of a phenolic resin (SN-485) were dissolved with an appropriate amount of a solvent and stirred for 2 hours or more.

Then 55% of silica 3 (D50 is 0.5 μm, D100:D10 is 2.0, and the purity is 99.90%) obtained by organosilicon hydrolysis was added, and continued to be stirred for 4 hours or more to be mixed fully, so as to form a varnish with a solid content of 70%.

The above varnish was coated on a release film, dried in air, and baked in an oven at 100° C. for 3 minutes to obtain an adhesive film with a semi-cured resin layer. The semi-cured adhesive film (with a thickness of 40 μm) and a PCB board after brown oxidation were laminated and cured, removed from the release film, and then subjected to surface treatment, chemical copper plating and electroplating, so as to form a build-up printed circuit board with circuits.

Comparative Example 5

An adhesive film was prepared by the same method as in Example 1 except that the proportion of silica prepared by the chemical method used in Example 1 was changed.

Firstly, 28 parts of an epoxy resin (NC-3000H) and 21 parts of a phenolic resin (SN-485) were dissolved with an appropriate amount of a solvent and stirred for 2 hours or more.

Then 90% of silica 3 (D50 is 0.5 μm, D100:D10 is 2.0, and the purity is 99.90%) obtained by organosilicon hydrolysis was added, and continued to be stirred for 4 hours or more to be mixed fully, so as to form a varnish with a solid content of 70%.

The above varnish was coated on a release film, dried in air, and baked in an oven at 100° C. for 3 minutes to obtain an adhesive film with a semi-cured resin layer. The semi-cured adhesive film (with a thickness of 40 μm) and a PCB board after brown oxidation were laminated and cured, removed from the release film, and then subjected to surface treatment, chemical copper plating and electroplating, so as to form a build-up printed circuit board with circuits.

Comparative Example 6

An adhesive film was prepared by the same method as in Example 7 except that the silica prepared by the chemical method used in Example 7 was changed.

Firstly, 20 parts of an epoxy resin (NC-3000H), 10 parts of a cyanate ester (XU-371) and 10 parts of an active ester (HP-8000-65T) were dissolved with an appropriate amount of a solvent and stirred for 2 hours or more.

Then 61% of silica 4 (D50 is 3.5 μm, D100:D10 is 5.0, and the purity is 99.90%) obtained by organosilicon hydrolysis was added, and continued to be stirred for 4 hours or more to be mixed fully, so as to form a varnish with a solid content of 70%.

The above varnish was coated on a release film, dried in air, and baked in an oven at 100° C. for 3-5 minutes to obtain an adhesive film with a semi-cured resin layer. The semi-cured adhesive film (with a thickness of 40 μm) and a PCB board after brown oxidation were laminated and cured, removed from the release film, and then subjected to surface treatment, chemical copper plating and electroplating, so as to form a build-up printed circuit board with circuits.

Comparative Example 7

An adhesive film was prepared by the same method as in Example 7 except that the silica prepared by the chemical method used in Example 7 was changed.

Firstly, 20 parts of an epoxy resin (NC-3000H), 10 parts of a cyanate ester (XU-371) and 10 parts of an active ester (HP-8000-65T) were dissolved with an appropriate amount of a solvent and stirred for 2 hours or more.

Then 61% of silica 5 (D50 is 2.0 μm, D100:D10 is 5.0, and the purity is 99.00%) obtained by organosilicon hydrolysis was added, and continued to be stirred for 4 hours or more to be mixed fully, so as to form a varnish with a solid content of 70%.

The above varnish was coated on a release film, dried in air, and baked in an oven at 100° C. for 3-5 minutes to obtain an adhesive film with a semi-cured resin layer. The semi-cured adhesive film (with a thickness of 40 μm) and a PCB board after brown oxidation were laminated and cured, removed from the release film, and then subjected to surface treatment, chemical copper plating and electroplating, so as to form a build-up printed circuit board with circuits.

Comparative Example 8

An adhesive film was prepared by the same method as in Example 7 except that the silica prepared by the chemical method used in Example 7 was changed to silicon micropowder.

Firstly, 20 parts of an epoxy resin (NC-3000H), 10 parts of a cyanate ester (XU-371) and 10 parts of an active ester (HP-8000-65T) were dissolved with an appropriate amount of a solvent and stirred for 2 hours or more.

Then 61% of silicon micropowder (SC2500-SQ) was added, and continued to be stirred for 4 hours or more to be mixed fully, so as to form a varnish with a solid content of 70%.

The above varnish was coated on a release film, dried in air, and baked in an oven at 100° C. for 3-5 minutes to obtain an adhesive film with a semi-cured resin layer. The semi-cured adhesive film (with a thickness of 40 µm) and a PCB board after brown oxidation were laminated and cured, removed from the release film, and then subjected to surface treatment, chemical copper plating and electroplating, so as to form a build-up printed circuit board with circuits.

Comparative Example 9

An adhesive film was prepared by the same method as in Example 7 except that the proportion of silica prepared by the chemical method used in Example 7 was changed.

Firstly, 20 parts of an epoxy resin (NC-3000H), 10 parts of a cyanate ester (XU-371) and 10 parts of an active ester (HP-8000-65T) were dissolved with an appropriate amount of a solvent and stirred for 2 hours or more.

Then 55% of silica 3 (D50 is 0.5 µm, D100:D10 is 2.0, and the purity is 99.90%) obtained by organosilicon hydrolysis was added, and continued to be stirred for 4 hours or more to be mixed fully, so as to form a varnish with a solid content of 70%.

The above varnish was coated on a release film, dried in air, and baked in an oven at 100° C. for 3 minutes to obtain an adhesive film with a semi-cured resin layer. The semi-cured adhesive film (with a thickness of 40 µm) and a PCB board after brown oxidation were laminated and cured, removed from the release film, and then subjected to surface treatment, chemical copper plating and electroplating, so as to form a build-up printed circuit board with circuits.

Comparative Example 10

An adhesive film was prepared by the same method as in Example 8 except that the silica prepared by the chemical method used in Example 8 was changed.

Firstly, 20 parts of a hydrocarbon resin (XU-371), 20 parts of a polyphenylene ether resin (MX9000) and 5 parts of a co-crosslinking agent (DVB) were dissolved with an appropriate amount of a solvent and stirred for 2 hours or more.

Then 61% of silica 4 (D50 is 3.5 µm, D100:D10 is 5.0, and the purity is 99.90%) obtained by organosilicon hydrolysis was added, and continued to be stirred for 4 hours or more to be mixed fully, so as to form a varnish with a solid content of 70%.

The above varnish was coated on a release film, dried in air, and baked in an oven at 100° C. for 3-5 minutes to obtain an adhesive film with a semi-cured resin layer. The semi-cured adhesive film (with a thickness of 40 µm) and a PCB board after brown oxidation were laminated and cured, removed from the release film, and then subjected to surface treatment, chemical copper plating and electroplating, so as to form a build-up printed circuit board with circuits.

Comparative Example 11

An adhesive film was prepared by the same method as in Example 8 except that the silica prepared by the chemical method used in Example 8 was changed.

Firstly, 20 parts of a hydrocarbon resin (XU-371), 20 parts of a polyphenylene ether resin (MX9000) and 5 parts of a co-crosslinking agent (DVB) were dissolved with an appropriate amount of a solvent and stirred for 2 hours or more.

Then 61% of silica 5 (D50 is 2.0 µm, D100:D10 is 5.0, and the purity is 99.00%) obtained by organosilicon hydrolysis was added, and continued to be stirred for 4 hours or more to be mixed fully, so as to form a varnish with a solid content of 70%.

The above varnish was coated on a release film, dried in air, and baked in an oven at 100° C. for 3-5 minutes to obtain an adhesive film with a semi-cured resin layer. The semi-cured adhesive film (with a thickness of 40 µm) and a PCB board after brown oxidation were laminated and cured, removed from the release film, and then subjected to surface treatment, chemical copper plating and electroplating, so as to form a build-up printed circuit board with circuits.

Comparative Example 12

An adhesive film was prepared by the same method as in Example 8 except that the silica prepared by the chemical method used in Example 8 was changed to silicon micropowder.

Firstly, 20 parts of a hydrocarbon resin (XU-371), 20 parts of a polyphenylene ether resin (MX9000) and 5 parts of a co-crosslinking agent (DVB) were dissolved with an appropriate amount of a solvent and stirred for 2 hours or more.

Then 61% of silicon micropowder (SC2500-SQ) was added, and continued to be stirred for 4 hours or more to be mixed fully, so as to form a varnish with a solid content of 70%.

The above varnish was coated on a release film, dried in air, and baked in an oven at 100° C. for 3-5 minutes to obtain an adhesive film with a semi-cured resin layer. The semi-cured adhesive film (with a thickness of 40 µm) and a PCB board after brown oxidation were laminated and cured, removed from the release film, and then subjected to surface treatment, chemical copper plating and electroplating, so as to form a build-up printed circuit board with circuits.

Comparative Example 13

An adhesive film was prepared by the same method as in Example 8 except that the proportion of silica prepared by the chemical method used in Example 8 was changed.

Firstly, 20 parts of a hydrocarbon resin (XU-371), 20 parts of a polyphenylene ether resin (MX9000) and 5 parts of a co-crosslinking agent (DVB) were dissolved with an appropriate amount of a solvent and stirred for 2 hours or more.

Then 55% of silica 3 (D50 is 0.5 µm, D100:D10 is 2.0, and the purity is 99.90%) obtained by organosilicon hydrolysis was added, and continued to be stirred for 4 hours or more to be mixed fully, so as to form a varnish with a solid content of 70%.

The above varnish was coated on a release film, dried in air, and baked in an oven at 100° C. for 3 minutes to obtain an adhesive film with a semi-cured resin layer. The semi-cured adhesive film (with a thickness of 40 µm) and a PCB board after brown oxidation were laminated and cured, removed from the release film, and then subjected to surface treatment, chemical copper plating and electroplating, so as to form a build-up printed circuit board with circuits.

The performance of the build-up printed circuit boards or the copper-clad laminates in the above examples and comparative examples is tested, and the test items and methods are as follows:
- (1) tensile strength (30° C.): the DMA method is adopted, where the temperature is kept at 30° C. for 5 min, and the preloading force is 0.01 N, and 3 N/min is increased to 17.5 N/min;
- (2) peel strength: the method of IPC-TM-650 2.4.9 is used for testing;
- (3) drilling processability: after laser drilling, the hole is sliced and then observed for the verticality, where the verticality of 90-95 degrees is evaluated as excellent, 96-100 degrees is evaluated as good, 101-110 degrees is evaluated as fair, greater than 110 degrees is evaluated as poor;
(4) adhesive-filling effect: the circuit board is manufactured with laminating the adhesive film, then sliced, and observed for the adhesive filling condition between the circuit lines: the condition that the resin layer between the circuit lines does not have bubbles is evaluated as "excellent"; the condition that the resin layer between the circuit lines has bubbles and the bubble diameter is less than 1 micron is evaluated as "good"; and the condition that the resin layer between the circuit lines has bubbles and the bubble diameter is more than 1 micron is evaluated as "poor";
(5) electric strength: the method of IPC-TM-650 2.5.6.2A is used for testing;
(6) capability to manufacture fine circuit lines: the minimum line width/spacing which is able to be manufactured is measured; and
(7) DK/DF: the SPDR (Splite Post Dielectric Resonator) method is used for testing, where the test condition is A-state and the frequency is 10 GHz.

The comparison of performance tests are shown in Table 1 to Table 4.

TABLE 1

|  | Example 1 Adhesive film | Example 2 Adhesive film | Example 3 Adhesive film | Example 4 RCC |
|---|---|---|---|---|
| Epoxy resin + Phenolic resin | ✓ | ✓ | ✓ | ✓ |
| Epoxy resin + Cyanate ester + Active ester |  |  |  |  |
| Hydrocarbon resin + Polyphenylene ether resin + Co-crosslinking agent |  |  |  |  |
| Silica 1 obtained by organosilicon hydrolysis |  |  |  |  |
| Silica 2 obtained by organosilicon hydrolysis |  |  |  |  |
| Silica 3 obtained by organosilicon hydrolysis | 61% | 73% | 85% | 61% |
| Silica 4 obtained by organosilicon hydrolysis |  |  |  |  |
| Silica 5 obtained by organosilicon hydrolysis |  |  |  |  |
| Silicon micropowder |  |  |  |  |
| Tensile strength (30° C.) | 56 Mpa | 78 Mpa | 100 Mpa | 56 Mpa |
| Peel strength | 8.0 N/cm | 7.4 N/cm | 7.0 N/cm | 9.0 N/cm |
| Drilling processability | excellent | excellent | excellent | excellent |
| Adhesive filling effect | excellent | excellent | excellent | excellent |
| Electric strength | 88 kV/mm | 85 kV/mm | 83 kV/mm | 88 kV/mm |
| Capability to manufacture fine circuit lines (line width/spacing) | 15/15 | 15/15 | 15/15 | 20/20 |
| DK/DF (10 GHZ) | 3.32/0.012 | 3.20/0.010 | 3.10/0.008 | 3.32/0.012 |

TABLE 2

|  | Example 5 Adhesive film | Example 6 Adhesive film | Example 7 Adhesive film | Example 8 Adhesive film | Example 9 PP |
|---|---|---|---|---|---|
| Epoxy resin + Phenolic resin | ✓ | ✓ |  |  |  |
| Epoxy resin + Cyanate ester + Active ester |  |  | ✓ |  | ✓ |
| Hydrocarbon resin + Polyphenylene ether resin + Co-crosslinking agent |  |  |  | ✓ |  |
| Silica 1 obtained by organosilicon hydrolysis | 61% |  |  |  |  |
| Silica 2 obtained by organosilicon hydrolysis |  | 61% |  |  |  |
| Silica 3 obtained by organosilicon hydrolysis |  |  | 61% | 61% | 61% |
| Silica 4 obtained by organosilicon hydrolysis |  |  |  |  |  |
| Silica 5 obtained by organosilicon hydrolysis |  |  |  |  |  |
| Silicon micropowder |  |  |  |  |  |

TABLE 2-continued

|  | Example 5 Adhesive film | Example 6 Adhesive film | Example 7 Adhesive film | Example 8 Adhesive film | Example 9 PP |
|---|---|---|---|---|---|
| Tensile strength (30° C.) | 54 Mpa | 58 Mpa | 50 Mpa | 51 Mpa | 87 Mpa |
| Peel strength | 7.8 N/cm | 8.2 N/cm | 7.5 N/cm | 7.4 N/cm | 8.0 N/cm |
| Drilling processability | excellent | excellent | excellent | excellent | excellent |
| Adhesive filling effect | excellent | excellent | excellent | excellent | excellent |
| Electric strength | 90 kV/mm | 89 kV/mm | 87 kV/mm | 86 kV/mm | 87 kV/mm |
| Capability to manufacture fine circuit lines (line width/spacing) | 15/15 | 15/15 | 15/15 | 15/15 | / |
| DK/DF (10 GHZ) | 3.32/0.014 | 3.31/0.013 | 3.02/0.005 | 2.95/0.004 | 3.08/0.006 |

TABLE 3

|  | Comparative Example 1 Adhesive film | Comparative Example 2 Adhesive film | Comparative Example 3 Adhesive film | Comparative Example 4 Adhesive film | Comparative Example 5 Adhesive film | Comparative Example 6 Adhesive film |
|---|---|---|---|---|---|---|
| Epoxy resin + Phenolic resin | ✓ | ✓ | ✓ | ✓ | ✓ |  |
| Epoxy resin + Cyanate ester + Active ester |  |  |  |  |  | ✓ |
| Hydrocarbon resin + Polyphenylene ether resin + Co-crosslinking agent |  |  |  |  |  |  |
| Silica 1 obtained by organosilicon hydrolysis |  |  |  |  |  |  |
| Silica 2 obtained by organosilicon hydrolysis |  |  |  |  |  |  |
| Silica 3 obtained by organosilicon hydrolysis |  |  |  | 55% | 90% |  |
| Silica 4 obtained by organosilicon hydrolysis | 61% |  |  |  |  | 61% |
| Silica 5 obtained by organosilicon hydrolysis |  | 61% |  |  |  |  |
| Silicon micropowder |  |  | 61% |  |  |  |
| Tensile strength (30° C.) | 28 Mpa | 33 Mpa | 15 Mpa | 25 Mpa | 50 Mpa | 28 Mpa |
| Peel strength | 4.3 N/cm | 6.0 N/cm | 4.5 N/cm | 8.0 N/cm | 3.0 N/cm | 4.2 N/cm |
| Drilling processability | fair | good | poor | excellent | fair | fair |
| Adhesive filling effect | good | good | good | excellent | poor | good |
| Electric strength | 56 kV/mm | 38 kV/mm | 35 kV/mm | 90 kV/mm | 56 kV/mm | 56 kV/mm |
| Capability to manufacture fine circuit lines (line width/spacing) | 30/30 | 25/25 | 40/40 | 15/15 | 30/30 | 30/30 |
| DK/DF (10 GHZ) | 3.42/0.014 | 3.42/0.015 | 3.62/0.023 | 3.43/0.015 | 3.23/0.013 | 3.12/0.006 |

TABLE 4

| | Comparative Example 7 Adhesive film | Comparative Example 8 Adhesive film | Comparative Example 9 Adhesive film | Comparative Example 10 Adhesive film | Comparative Example 11 Adhesive film | Comparative Example 12 Adhesive film | Comparative Example 13 Adhesive film |
|---|---|---|---|---|---|---|---|
| Epoxy resin + Phenolic resin | | | | | | | |
| Epoxy resin + Cyanate ester + Active ester | ✓ | ✓ | ✓ | | | | |
| Hydrocarbon resin + Polyphenylene ether resin + Co-crosslinking agent | | | | ✓ | ✓ | ✓ | ✓ |
| Silica 1 obtained by organosilicon hydrolysis | | | | | | | |
| Silica 2 obtained by organosilicon hydrolysis: D50 is 0.1 μm, D100:D10 is 2.5, and the purity is 99.90% | | | | | | | |
| Silica 3 obtained by organosilicon hydrolysis: D50 is 0.5 μm, D100:D10 is 2.0, and the purity is 99.90% | | | 55% | | | | 55% |
| Silica 4 obtained by organosilicon hydrolysis: D50 is 3.5 μm, D100:D10 is 5.0, and the purity is 99.90% | | | | 61% | | | |
| Silica 5 obtained by organosilicon hydrolysis: D50 is 2.0 μm, D100:D10 is 5.0, and the purity is 99.00% | 61% | | | | 61% | | |
| Silicon micropowder | | 61% | | | | 61% | |
| Tensile strength (30° C.) | 32 Mpa | 14 Mpa | 34 Mpa | 27 Mpa | 33 Mpa | 14 Mpa | 33 Mpa |
| Peel strength | 6.1 N/cm | 4.3 N/cm | 8.1 N/cm | 4.1 N/cm | 6.0 N/cm | 4.3 N/cm | 8.0 N/cm |
| Drilling processability | good | poor | excellent | fair | good | poor | excellent |
| Adhesive filling effect | good | good | excellent | good | good | good | excellent |
| Electric strength | 38 kV/mm | 35 kV/mm | 90 kV/mm | 55 kV/mm | 39 kV/mm | 34 kV/mm | 89 kV/mm |
| Capability to manufacture fine circuit lines (line width/spacing) | 25/25 | 40/40 | 15/15 | 30/30 | 25/25 | 40/40 | 15/15 |
| DK/DF (10 GHZ) | 3.04/0.005 | 3.32/0.008 | 3.08/0.005 | 3.02/0.006 | 3.01/0.005 | 3.22/0.007 | 3.02/0.005 |

As can be seen from Tables 1-4, the tensile strength (50-100 Mpa) and peel strength (7.0-9.0 N/cm) of the examples are higher, the drilling processability is better, the adhesive-filling capability is better, the electric strength (83-90 kV/mm) is higher, and the DK/DF is lower, where DK is as low as 2.95-3.32 and DF is as low as 0.004-0.014, and the capability to manufacture thinner circuit lines can be realized, and meanwhile, better electrical performance can be obtained.

In comparison with Example 1, Comparative Example 1 and Comparative Example 2 use silica obtained by organosilicon hydrolysis with a particle size without the range of the present application, the tensile strength, peel strength, and electric strength of the obtained adhesive film are lower, and meanwhile, the drilling processability and adhesive-filling capability are inferior; Comparative Example 3 uses silica micropowder, the tensile strength and electric strength of the obtained adhesive film are significantly reduced, and meanwhile, the DK/DF is larger, and the capability to manufacture circuit lines is also inferior; in Comparative Example 4, the proportion of silica is reduced to 55%, and the tensile strength of the obtained adhesive film is reduced significantly; in Comparative Example 5, the proportion of silica is increased to 90%, the tensile strength and electric strength of the obtained adhesive film is lower, the peel strength is reduced significantly, and the adhesive-filling capability is also reduced.

In comparison with Example 7, Comparative Example 6 and Comparative Example 7 use silica obtained by organosilicon hydrolysis with a particle size without the range of the present application, the tensile strength, peel strength, and electric strength of the obtained adhesive film are lower, and meanwhile, the drilling processability and adhesive-filling capability are inferior; Comparative Example 8 uses silica micropowder, the tensile strength and electric strength of the obtained adhesive film are significantly reduced, and meanwhile, the DK/DF is larger, and the capability to manufacture circuit lines is also inferior; in Comparative Example 9, the proportion of silica is reduced to 55%, and the tensile strength of the obtained adhesive film is reduced significantly.

In comparison with Example 8, Comparative Example 10 and Comparative Example 11 use silica obtained by organosilicon hydrolysis with a particle size without the range of the present application, the tensile strength, peel strength, and electric strength of the obtained adhesive film are lower, and meanwhile, the drilling processability and adhesive-filling capability are inferior; Comparative Example 12 uses silica micropowder, the tensile strength and electric strength of the obtained adhesive film are significantly reduced, and meanwhile, the DK/DF is larger, and the capability to manufacture circuit lines is also inferior; in Comparative Example 13, the proportion of silica is reduced to 55%, and the tensile strength of the obtained adhesive film is reduced significantly.

The applicant has stated that although the resin composition and the application thereof of the present application are illustrated in terms of the above examples, the present application is not limited to the above examples, which means that the present application does not necessarily rely on the above examples to be implemented. It should be clear to those skilled in the art that any improvement of the present application, equivalent substitution of each raw material of the product of the present application, addition of auxiliary ingredients, selection of specific methods, etc. shall all fall within the protection scope and disclosure scope of the present application.

What is claimed is:

1. A resin composition, which comprises the following components by weight percentage: 15-39% of a crosslinking curable resin and 61-85% of a filler, wherein the filler is silica prepared by organosilicon hydrolysis, wherein the silica has an average particle size D50 of 0.1-3 μm, a ratio of D100 to D10 is less than or equal to 2.5 and greater than or equal to 1.0, and the silica has a purity of greater than 99.9%, wherein the crosslinking curable resin is a combination of an epoxy resin and a phenolic resin.

2. The resin composition according to claim 1, wherein the crosslinking curable resin is a thermosetting-curable resin or a photo-curable resin.

3. The resin composition according to claim 1, wherein the silica is obtained by subjecting an organosilicon to a hydrolysis reaction to obtain a preliminary product and then burning the preliminary product, wherein the burning is performed at 800-1300° C.

4. The resin composition according to claim 3, wherein the organosilicon is alkoxysilane, wherein the alkoxysilane comprises tetraethoxysilane, tetramethoxysilane, tetraphenoxysilane, tetra-n-butoxysilane, tetraisobutoxysilane, methyltriethoxysilane, or dimethyldiethoxysilane.

5. The resin composition according to claim 1, wherein the silica has an average particle size D50 of 0.3-1 μm.

6. An adhesive film, which is prepared by coating the resin composition according to claim 1 on a release material and then drying and/or baking, wherein the adhesive film has a thickness of 5-300 μm.

7. A resin-coated copper foil, which comprises a copper foil and the resin composition according to claim 1 attached to the copper foil by coating and drying, wherein a resin layer of the resin-coated copper foil has a thickness of 5-300 μm and the copper foil of the resin-coated copper foil has a thickness of 1-105 μm.

8. A semi-cured prepreg, which is prepared by impregnating glass fabric with the resin composition according to claim 1 and then drying.

9. A copper-clad laminate, which is prepared by using one or at least two of an adhesive film, a resin-coated copper foil, or a semi-cured prepreg,
wherein the adhesive film is prepared by coating the resin composition according to claim 1 on a release material and then drying and/or baking,
wherein the resin-coated copper foil comprises a copper foil and the resin composition according to claim 1 attached to the copper foil by coating and drying,
wherein the semi-cured prepreg is prepared by impregnating glass fabric with the resin composition according to claim 1 and then drying.

10. A multilayer board, which is prepared by using one or at least two of an adhesive film, a resin-coated copper foil, a semi-cured prepreg, or a copper-clad laminate,
wherein the adhesive film is prepared by coating the resin composition according to claim 1 on a release material and then drying and/or baking,
wherein the resin-coated copper foil comprises a copper foil and the resin composition according to claim 1 attached to the copper foil by coating and drying,
wherein the semi-cured prepreg is prepared by impregnating glass fabric with the resin composition according to claim 1 and then drying,
wherein the copper-clad laminate is prepared by using one or at least two of the adhesive film, the resin-coated copper foil, or the semi-cured prepreg.

11. The resin composition according to claim 1, wherein the epoxy resin comprises one or a combination of at least two of a bisphenol A epoxy resin, a bisphenol F epoxy resin, a phosphorus-containing epoxy resin, an MDI-modified epoxy resin, a phenolic epoxy resin, a biphenyl epoxy resin, a dicyclopentadiene epoxy resin, a naphthalene-containing epoxy resin, or an alicyclic epoxy resin.

12. The resin composition according to claim 1, wherein the phenolic resin comprises one or a combination of at least two of a bisphenol A phenolic resin, a phenol phenolic resin, a biphenyl phenolic resin, a dicyclopentadiene phenolic resin, or a naphthalene-containing phenolic resin.

13. The adhesive film according to claim 6, wherein the adhesive film has a thickness of 10-200 μm.

14. The adhesive film according to claim 6, wherein the adhesive film has a thickness of 20-100 μm.

15. The resin-coated copper foil according to claim 7, wherein the resin layer of the resin-coated copper foil has a thickness of 10-200 μm and the copper foil of the resin-coated copper foil has a thickness of 3-35 μm.

16. The resin-coated copper foil according to claim 7, wherein the resin layer of the resin-coated copper foil has a thickness of 20-100 μm and the copper foil of the resin-coated copper foil has a thickness of 3-12 μm.

* * * * *